United States Patent
Oshemkov et al.

(10) Patent No.: US 10,095,101 B2
(45) Date of Patent: Oct. 9, 2018

(54) CRITICAL DIMENSION VARIATION CORRECTION IN EXTREME ULTRAVIOLET LITHOGRAPHY

(71) Applicant: Carl Zeiss SMT GmbH, Oberkochen (DE)

(72) Inventors: Sergey Oshemkov, Karmiel (IL); Vladimir Kruglyakov, Migdal Haemek (IL); Frederik Blumrich, Jena (DE); Yuval Perets, Beit-Shearim (IL)

(73) Assignee: Carl Zeiss SMT GmbH, Oberkochen (DE)

( * ) Notice: Subject to any disclaimer, the term of this patent is extended or adjusted under 35 U.S.C. 154(b) by 8 days.

(21) Appl. No.: 15/189,058

(22) Filed: Jun. 22, 2016

(65) Prior Publication Data

US 2016/0370697 A1  Dec. 22, 2016

(30) Foreign Application Priority Data

Jun. 22, 2015 (IL) .......................... 239577

(51) Int. Cl.
| | |
|---|---|
| *G03F 1/24* | (2012.01) |
| *G03F 7/20* | (2006.01) |
| *G03F 1/22* | (2012.01) |

(52) U.S. Cl.
CPC .................. *G03F 1/24* (2013.01); *G03F 1/22* (2013.01); *G03F 7/70433* (2013.01); *G03F 7/70625* (2013.01)

(58) Field of Classification Search
CPC .... G03F 1/22; G03F 7/70433; G03F 7/70625; G03F 1/24
USPC ........................................................ 430/5, 30
See application file for complete search history.

(56) References Cited

U.S. PATENT DOCUMENTS

| | | | |
|---|---|---|---|
| 2012/0009511 A1* | 1/2012 | Dmitriev | G03F 1/72 430/5 |
| 2015/0085269 A1* | 3/2015 | Dmitriev | G03F 1/72 355/67 |

* cited by examiner

*Primary Examiner* — Christopher G Young
(74) *Attorney, Agent, or Firm* — Pearl Cohen Zedek Latzer Baratz LLP

(57) ABSTRACT

A method of correcting a critical dimension (CD) variation in extreme ultraviolet (EUV) photolithography includes mapping the CD variation of a wafer exposure field formed by a photolithography system that includes an EUV photolithography photomask. Parameters of a treatment to produce a change in reflectance at a working wavelength of EUV radiation in a region of a reflective multilayer of the photomask are determined, the change in reflectance being calculated to correct the mapped CD variation. A treatment beam is directed to the region. The region is treated with the beam in accordance with the determined parameters.

12 Claims, 6 Drawing Sheets

CRITICAL DIMENSION VARIATION CORRECTION IN EXTREME ULTRAVIOLET LITHOGRAPHY

CROSS REFERENCE TO RELATED APPLICATIONS

The present invention claims the priority benefit of Israeli Patent Application No. 239577, filed on Jun. 22, 2015, which is incorporated h its entirety herein by reference.

FIELD OF THE INVENTION

The present invention relates to a method and system for correcting critical dimension variations in extreme ultraviolet lithography.

BACKGROUND OF THE INVENTION

As miniaturization of integrated circuits continues, photolithography processes that use deep ultraviolet (DUV) radiation are often inadequate, typically at the wavelength of 193 nm. In order to support the further miniaturization, radiation with a wavelength that is an order of magnitude shorter than that of DUV radiation is required.

Developers of photolithography processes have turned to extreme ultraviolet (EUV) radiation. For example, EUV photolithography may utilize radiation at the wavelength 13.5 nm. A typical 13.5 nm radiation source includes a plasma (e.g., a laser-produced plasma) in which the radiation is produced.

A photolithography system based on EUV radiation differs in several aspects from a system based on DUV radiation. A DUV system typically involves transmitting optics (e.g., lenses). A DUV photomask typically involves a transparent substrate upon which a pattern of reflecting or absorbing material is deposited. Since EUV radiation is absorbed by materials, all EUV lithography optics are based on reflection, rather than transmission and refraction. Typical EUV optics is based on multilayer reflectors that reflect radiation as determined by Bragg's Law. The multilayer reflectors typically include a large number (e.g., 40 to 50, or more or fewer) of alternating layers of molybdenum (Mo) and silicon (Si). The reflectors are used in focusing and beam-directing optics, as well as in the photomask itself. A typical EUV photomask includes reflector upon which an absorbing material is deposited.

Process variations in lithographic printing of integrated circuits are characterized by variations in the sizes of structures (e.g., lines and spaces) printed on a substrate such as a silicon wafer. Variations of printed lines and spaces are measured as an average critical dimension (CD) size at different areas of the wafers. Variations in the width of lines and spaces imprinted on a wafer may occur, for example, due to photomask imperfections. Other sources of CD variations on the wafer may include, for example, unevenness on a chuck that holds a wafer or variations in the photolithography process.

SUMMARY OF THE INVENTION

There is thus provided, in accordance with an embodiment of the present invention, a method of correcting a critical dimension (CD) variation in extreme ultraviolet (EUV) photolithography, the method including: mapping the CD variation of a wafer exposure field formed by a photolithography system that includes an EUV photolithography photomask; determining one or a plurality of parameters of a treatment to produce a change in reflectance at a working wavelength of EUV radiation in a region of a reflective multilayer of the photomask, the change in reflectance being calculated to correct the mapped CD variation; directing a treatment beam to the region; and treating the region with the beam in accordance with the determined one or a plurality of parameters.

Furthermore, in accordance with an embodiment of the present invention, the treatment beam includes a beam of a continuous wave or pulsed laser.

Furthermore, in accordance with an embodiment of the present invention, the pulsed laser includes a femtosecond pulsed laser.

Furthermore, in accordance with an embodiment of the present invention, a parameter of the one or a plurality of parameters is selected from a group of parameters consisting of pulse energy, pulse duration, pulse rate, exposure time, scan rate, focal length, distance, and pitch of a scanning pattern.

Furthermore, in accordance with an embodiment of the present invention, determining the one or a plurality of parameters includes utilizing a result of a calibration that includes treating a plurality of regions of a reflective multilayer surface in accordance with different values of the one or a plurality of parameters.

Furthermore, in accordance with an embodiment of the present invention, the working wavelength is substantially equal to 13.5 nm.

Furthermore, in accordance with an embodiment of the present invention, the produced change in reflectance of the working wavelength includes changing a peak value of a reflectance spectrum of the region or wavelength shifting of a peak of a reflectance spectrum of the region.

Furthermore, in accordance with an embodiment of the present invention, directing the beam to the region includes translating a source of the beam or the photomask, or operating beam optics.

Furthermore, in accordance with an embodiment of the present invention, treating the region with the beam includes scanning the beam across the region.

Furthermore, in accordance with an embodiment of the present invention, scanning the beam includes scanning the beam with a raster pattern.

Furthermore, in accordance with an embodiment of the present invention, the raster pattern includes a sequence of overlapping laser spots.

Furthermore, in accordance with an embodiment of the present invention, a ratio of a diameter of a laser spot of the sequence of overlapping laser spots to a pitch of the raster pattern is in the range of 1 to 100.

Furthermore, in accordance with an embodiment of the present invention, an energy density of the treatment ranges from 10 mJ/cm$^2$ to 10 J/cm$^2$.

Furthermore, in accordance with an embodiment of the present invention, the energy density is less than 200 mJ/cm$^2$.

Furthermore, in accordance with an embodiment of the present invention, mapping the CD variation includes examination of a wafer that is printed using the photomask, examination of the photomask, or sensing a pattern of radiation in the photolithography system.

Furthermore, in accordance with an embodiment of the present invention, the treatment beam heats the region.

There is further provided, in accordance with an embodiment of the present invention, a photomask including: a multilayer on a substrate, the multilayer being reflective at a working wavelength of EUV radiation, one or a plurality of regions of the multilayer being locally treated to modify a reflectance at the working wavelength of a region of the one or a plurality of regions so as to compensate for a mapped critical dimension (CD) variation; and a pattern of a material that is absorbing at the working wavelength, the pattern being on the multilayer.

Furthermore, accordance with an embodiment of the present invention, the multilayer includes a plurality of alternating layers silicon and molybdenum.

Furthermore, in accordance with an embodiment of the present invention, the one or a plurality of regions are locally treated by heating.

There is further provided, in accordance with an embodiment of the present invention, a system for correcting a CD variation in EUV photolithography, the system including: a radiation source to produce a treatment beam; and a controller configured to direct the treatment beam at a region of a reflective multilayer of an EUV photolithography photomask and to operate the source to treat the region with the beam in accordance with one or a plurality of parameters to produce a change in reflectance at a working wavelength of EUV radiation in the region, the change in reflectance being calculated to correct a mapped CD variation.

Furthermore, in accordance with an embodiment of the present invention, the treatment beam is configured to irradiate the region via a substrate of the photomask.

Furthermore, in accordance with an embodiment of the present invention, the system includes optics to direct, focus, filter or collimate the beam.

Furthermore, in accordance with an embodiment of the present invention, the optics are configured to scan the beam over the region.

Furthermore, in accordance with an embodiment of the present invention, the radiation source includes a continuous wave or pulsed laser.

Furthermore, in accordance with an embodiment of the present invention, the system is configured to produce relative translation between the radiation source and the photomask.

Furthermore, in accordance with an embodiment of the present invention, the system is configured to heat the region with the treatment beam.

There is further provided, in accordance with an embodiment of the present invention, a method for reducing reflection by a black border of a photomask for EUV photolithography, the method including: directing a treatment beam to a reflective multilayer of the photomask at the black border; and treating the region with the beam so as to reduce reflection of the multilayer to at least a predetermined reflectance value.

Furthermore, in accordance with an embodiment of the present invention, the treatment beam is directed to the reflective multilayer through a backside coating and a photomask substrate.

Furthermore, in accordance with an embodiment of the present invention, the predetermined reflectance value is 5%.

Furthermore, in accordance with an embodiment of the present invention, the treatment beam heats the reflective multilayer.

BRIEF DESCRIPTION OF THE DRAWINGS

In order for the present invention, to be better understood and for its practical applications to be appreciated, the following Figures are provided and referenced hereafter. It should be noted that the Figures are given as examples only and in no way limit the scope of the invention. Like components are denoted by like reference numerals.

DETAILED DESCRIPTION OF THE INVENTION

Figure 1:
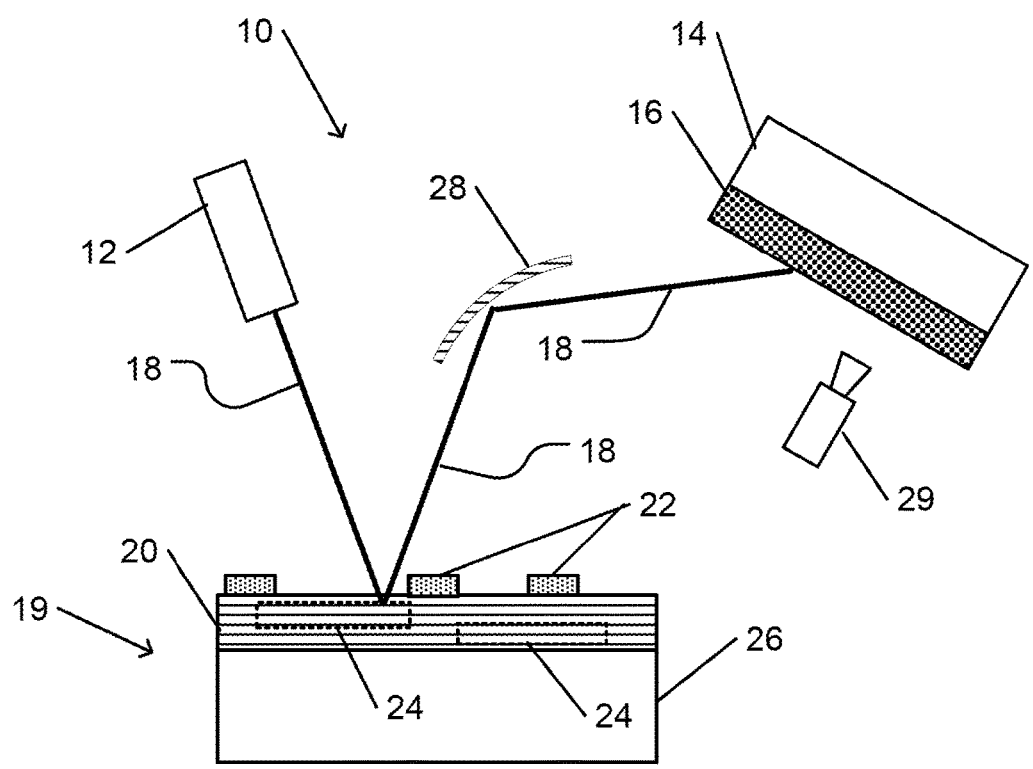
FIG. 1 schematically illustrates an extreme ultraviolet (EUV) photolithography system that utilizes critical dimension (CD) variation correction, in accordance with an embodiment of the present invention.

In the following detailed description, numerous specific details are set forth in order to provide a thorough understanding of the invention. However, it will be understood by those of ordinary skill in the art that the invention may be practiced without these specific details. In other instances, well-known methods, procedures, components, modules, units and/or circuits have not been described in detail so as not to obscure the invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium (e.g., a memory) that may store instructions to perform operations and/or processes. Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method embodiments described herein are not constrained to a particular order or sequence.

Additionally, some of the described method embodiments or elements thereof can occur or be performed simultaneously, at the same point in time, or concurrently. Unless otherwise indicated, us of the conjunction "or" as used herein is to be understood as inclusive (any or all of the stated options).

In accordance with an embodiment of the present invention, a reflective multilayer of an extreme ultraviolet (EUV) photomask is treated with a continuous wave (CW) laser, a pulsed laser (e.g., an ultrafast pulsed laser) or otherwise heated. The heating may modify the reflective properties of the reflector for EUV radiation having a particular working photolithography wavelength (e.g., 13.5 nm or another wavelength). For example, the selected working photolithography wavelength of EUV radiation may be a wavelength that is useful in application of EUV photolithography for printing on a wafer to produce an integrated circuit or other electronic component. Modification of the multilayer reflector may be utilized to compensate for critical dimension (CD) variation. The heat treatment may reduce the reflectance of the multilayer reflector at the working photolithography wavelength (e.g., as measured for a particular incidence or reflectance angle). Thus, reduced reflectance may compensate for CD variations that were detected in the reflective photomask prior to the treatment. The required reduction in reflection may be determined in accordance with a measured degree of CD variation. Reducing the intensity of the reflected EUV radiation in a region of the photomask may (e.g., where the CD is above a target value) reduce the CD in that region.

CD variations in a photolithography system that includes the reflective photomask may be mapped, detected, or measured. The mapping may be direct, e.g., by examining results of wafer that was produced by a photolithography process using the photo system with the photomask. Scanning electron micrography (SEM) or other examination of the printed wafer of a treated substrate may reveal one or more CD variations. The pattern of radiation to which the wafer is exposed may be referred to as a wafer exposure field of, the photolithography system, or a wafer exposure field that is formed by the photolithography system. Alternatively, or in addition, the mapping may be indirect. For example, the photomask itself may be examined, or a pattern of radiation along the optical path of the photolithography system that incorporates the EUV photomask may be sensed. The results of such indirect mapping measurements may be incorporated into a model (e.g., ray trace, field calculation, exposure simulation, or other model) to predict the effect on a that is produced by the photolithography system with the photomask CD variations may arise from non-uniformity of the photomask itself, from non-uniform illumination of the photomask, or from other factors that affect a pattern of EUV radiation in an EUV photolithography system that incorporates the photomask. Non-uniform illumination may result from non-uniformity of the illumination source (e.g., laser-produced plasma that emits radiation at the working photolithography wavelength) or from other components of the system optics (e.g., the reflective surfaces used to direct and focus the illumination during photolithography). In some cases, the combination of various contributions to the CD variations may reinforce one another, or may partially or completely cancel one another out. Thus, it may be necessary to take all contributions into consideration when mapping the CD variations.

Parameters of a treatment process in which the multilayer reflector is treated to attain a compensating reduction reflectance may be determined by a calibration process. For example, different areas of a multilayer reflector may be treated differently and the results may be evaluated. For example, different areas of the multilayer reflector may be exposed to laser radiation when parameters of operation of the laser are varied. For example, the variations may result in irradiation of different regions of the multilayer reflector while operational parameters of the laser differ in one or more ways. Such irradiation differences may include differing rates of irradiation (e.g., different pulse energy density of a pulsed laser, scan rate, pitch of a scan pattern or raster pattern during irradiation), or different quantities of total irradiation (e.g., exposure time, exposure dose).

Results of exposure during the calibration process may be examined in different ways. Reflectance measurements, or spectral reflectance measurements, may reveal changes in reflectance at the working photolithography wavelength, or in a spectral region that includes the working photolithography wavelength. A spectral reflective measurement may reveal wavelength shifts in a reflectance spectrum that includes the working photolithography wavelength.

FIG. 1 schematically illustrates an extreme ultraviolet (EUV) photolithography system that utilizes critical dimension variation correction, in accordance with an embodiment of the present invention.

EUV photolithography system 10 is configured to expose photoresist 16 on substrate 14 with EUV radiation that is patterned by absorber pattern 22 of reflective photomask 19. Absorber pattern 22 includes lines or other features that are fashioned of a material that is absorbing to EUV radiation at least at a working photolithography wavelength. Features of absorber pattern 22 are configured to shade and prevent exposure of a corresponding pattern on photoresist 16 to the EUV radiation. Exposure or lack of exposure to the EUV radiation may affect the susceptibility to removal of regions of photoresist 16 during later exposure to a developer solution or material.

EUV radiation beam 18 is produced by EUV radiation source 12. For example, EUV radiation source 12 may include a laser-produced plasma source, discharge-produced plasma source, free-electron laser, or other device that is capable of generating EUV radiation. EUV radiation source 12 may include collimating or filtering optics to produce EUV radiation beam 18 of narrowband radiation at (e.g., centered about) the working photolithography wavelength. The working photolithography wavelength may be 13.5 nm, or another suitable EUV wavelength. For example, optics of EUV radiation beam 18 may include one or more selective mirrors (e.g., multilayer mirrors) that selectively reflect radiation of a particular wavelength into a particular direction (e.g., due to the Bragg effect).

The optical path of EUV radiation beam 18 may include EUV optics 28 (collectively and schematically represented by a concave multilayered reflecting surface). EUV optics 28 may include one or more grouped or physically separated components that are configured to direct, focus, filter, collimate, absorb, or otherwise optically modify EUV radiation beam 18. Although EUV optics 28 are schematically represented in the optical path of EUV radiation beam 18 between reflective photomask 19 and photoresist 16, some components of EUV optics 28 may be placed elsewhere, e.g., between EUV radiation source 12 and reflective photomask 19, or elsewhere in the optical path of EUV radiation beam 18.

Reflective photomask 19 includes reflective multilayer 20. Reflective multilayer may include a plurality (e.g., 40 to 50, or another number) of hi-layers. For example, each bi-layer may include a layer of molybdenum and a layer of silicon. A typical bi-layer for selective reflection of 13.5 nm radiation may have a thickness of about 6.9 nm. In some cases, a topmost (e.g., exposed) layer may include another material, e.g., ruthenium.

Reflective multilayer 20 may include one or more treated multilayer regions 24. (It should be noted that an actual treated multilayer region 24 typically is much larger than an individual feature of absorber pattern 22, and typically many such features are included within the area of a single treated multilayer region 24.) A treated multilayer region 24 may have been locally treated (e.g., by laser radiation or otherwise) so as to modify the reflection of EUV radiation at the working photolithography wavelength. For example, the treatment may affect a local structure of reflective multilayer 20. The local structure may be affected by one or more mechanical or structural effects (e.g., expansion, contraction, warping, or other mechanical or structural effects), by chemical effects (e.g., heat induced chemical interactions among components of reflective multilayer 20, or other chemical effects), or other effects. The modification of local structure due to the treatment may modify the optical properties of treated multilayer region 24. The modification of the optical properties may include reducing the reflectance at the working photolithography wavelength of treated multilayer region 24 relative to the reflectance at the working photolithography wavelength of untreated regions of reflective multilayer 20. (When the reflectance of reflective multilayer 20 is not optimized for the working photolithography wavelength, the treatment may result in an increase in reflectance at the working photolithography wavelength.)

A treated multilayer region 24 may not have well-defined boundaries. Thus, the reflectance at the working photolithography wavelength may vary gradually across a transition from treated multilayer region 24 to a neighboring untreated region of reflective multilayer 20. Furthermore, adjacent treated multilayer regions 24 may partially overlap one another, with the reflectance at the working photolithography wavelength varying from one of the adjacent treated multilayer regions 24 to the other.

Photomask substrate 26 may be formed of a material with a low coefficient of thermal expansion (e.g., a material based on fused silica, or another material with a low coefficient of thermal expansion). The low coefficient of thermal expansion may ensure that absorber pattern 22 does not appreciably expand or contract (e.g., the expansion or contraction is too small to effect operation of a component that is produced as a result of the photolithography process) as a result of temperature changes that may be expected during EUV photolithography.

When EUV radiation beam 18 is reflected from treated multilayer region 24, the reduced reflection may compensate for one or more previously detected CD variations in irradiating photoresist 16. For example, such CD variation may result from inaccuracies caused by EUV radiation source 12, absorber pattern 22, EUV optics 28, or another component of reflective photomask 19 or EUV photolithography system 10.

For example, EUV photolithography system 10 may include or communicate with an inspection unit 29. Inspection unit 29 may include one or more devices that are configured to inspect or examine a wafer print that is produced using reflective photomask 19.

One or more regions of reflective multilayer 20 may be heated, or otherwise treated, to form one or more treated multilayer regions 24.

Figure 2A:
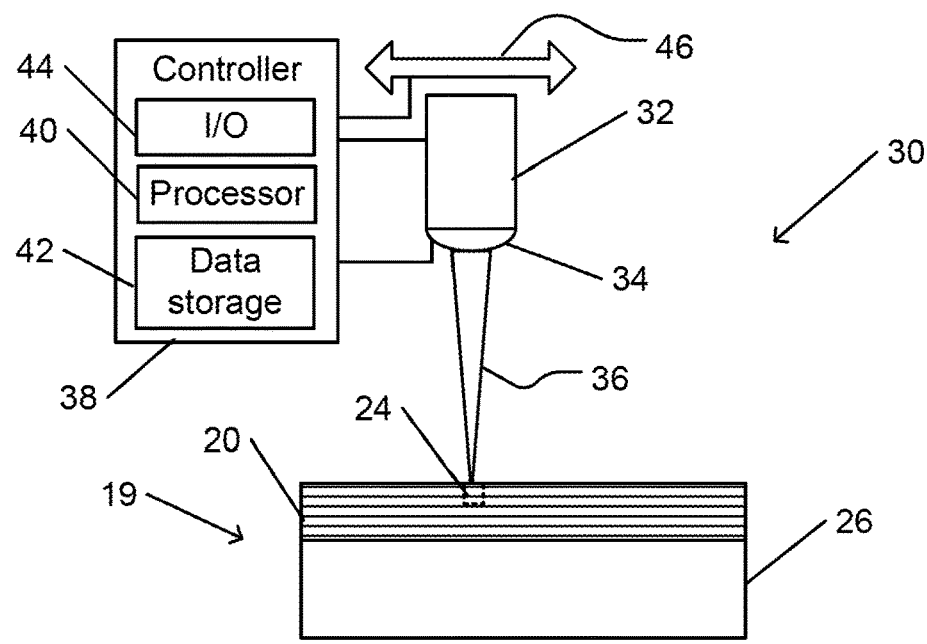
FIG. 2A schematically illustrates a system for treating a reflective photomask for EUV photolithography to correct for critical dimension variation, in accordance with an embodiment of the present invention.

FIG. 2A schematically illustrates a system for treating a reflective photomask for EUV photolithography to correct for critical dimension variation, in accordance with an embodiment of the present invention.

Photomask treatment system 30 is configured to treat a region of reflective multilayer 20 of reflective photomask 19 to form a treated multilayer region 24. Photomask treatment system 30 is configured to treat one or more regions of reflective multilayer 20 to form treated multilayer regions 24. A region of reflective multilayer 20 may be affected by depositing energy within the region. For example, the region may be irradiated by an treatment beam 36, e.g., produced by a laser or otherwise, or otherwise locally heated.

Treatment beam 36 may be produced by treatment radiation source 32. For example, treatment radiation source 32 may include or represent an ultrashort pulsed laser that produces picosecond pulses or shorter. The ultrashort pulsed laser may be a femtosecond pulsed laser. Treatment beam 36 may be focused, directed, collimated, or otherwise modified by beam optics 34. For example, beam optics 34 may direct treatment beam 36 to scan across a region of reflective multilayer 20 in a predetermined scan pattern, e.g., in a raster pattern. Such a raster pattern may be characterized by such parameters as a pitch (e.g., distance between sequential laser spots) and a scan rate. Such a raster pattern may be configured to deposit a quantity of energy within the region that is sufficient to produce a treated multilayer region 24.

For example, the reflectance of reflective multilayer 20 prior to treatment may be about 0.7. A treatment to change the reflectance of reflective multilayer 20 may include irradiation of reflective multilayer 20 with laser radiation having an energy density in the range of from about 10 $mJ/cm^2$ to about 10 $J/cm^2$. For example, in order for the reflectance to be changed from an initial value of about 70% to about 40% (a change of 30%), an energy density of about 2 $J/cm^2$ may be applied. In some cases, an appropriate compensating change in reflectance may be less than 3%. In such a case, the energy density of the irradiation may be about 200 $mJ/cm^2$ or less.

In order for a smooth and homogeneous change in the reflectance to be produced, a sequence of overlapping laser spots may be scanned over the surface of reflective multilayer 20 in the form of a raster pattern. The raster pattern may be characterized by a ratio of laser spot diameter to pitch. For example, the ratio of spot diameter to pitch may be in the range of from about 1 to about 100. In some cases, a pattern of non-overlapping laser spots may be applied.

Treatment beam 36 is directed at various regions of reflective multilayer 20. For example, one or more of treatment radiation source 32, beam optics 34, or reflective photomask 19 (or a stage or platform upon which reflective photomask 19 is mounted) may be configured to move with a one- or two-dimensional translational motion (schematically represented by translation motion 46) relative to one or more other components of photomask treatment system 30.

Operation of one or more components or operations of photomask treatment system 30 may be controlled by controller 38. For example, controller 38 may control operation of one or more of treatment radiation source 32 (e.g., turning on or off, pulse rate or energy, wavelength range, or other parameter of operation of treatment radiation source 32), beam optics 34 (e.g., focus, aperture, scanning rate, raster pattern parameters, or other operation of beam optics 34, translation motion 46 (e.g., of a translation mechanism), or other operation of photomask treatment system 30.

Controller 38 may include a processor 40. Alternatively or in addition, controller 38 may include digital or analog circuitry that is configured to control operation of one or more components of photomask treatment system 30.

For example, processor 40 may include one or more processing units, e.g., of one or more computers. One or more components of processor 40 may be incorporated into one or more components of photomask treatment system 30. Processor 40 may be configured to operate in accordance with programmed instructions.

Processor 40 may communicate with input/output unit 44. Input/output unit 44 may include a computer monitor or screen. Processor 40 may communicate with input/output unit 44 to display a status of one or more components of photomask treatment system 30. In another example, input/output unit 44 may include a printer, display panel, speaker, or another device capable of producing visible, audible, or tactile output.

Input/output unit 44 may include one or more user-operable controls to enable a user or operator of photomask treatment system 30 to start, stop, or otherwise control operation of one or more components of photomask treatment system 30. For example, an input device of input/output unit 44 may include one or more of a keyboard, keypad, pointing device, touch screen, or control panel for enabling a user to input commands, data, or instructions for operation of processor 40.

Input/output unit 44 may enable communication with, or transfer of data to or from, one or more other devices. For example, input/output unit 44 may enable communication with a system for measuring CD variation during use of reflective photomask 19 in photolithography. Input/output unit 44 may enable receiving data from inspection unit 29 of EUV photolithography system 10 (FIG. 1).

Processor 40 may communicate with data storage unit 42. Data storage unit 42 may include one or more fixed or removable, volatile or nonvolatile, memory or data storage devices. Data storage unit 42 may be utilized to store, for example, programmed instructions for operation of processor 40, data or parameters for use by processor 40 during operation, or results of operation of processor 40. For example, data storage unit 42 may be utilized to store results of inspection of a wafer print that is produced using reflective photomask 19, and parameters related to treatment of reflective multilayer 20 to produce a treated multilayer region 24.

Alternatively or in addition to direct irradiation of reflective multilayer 20 by treatment beam 36, reflective multilayer 20 may be treated by a treatment beam that traverses photomask substrate 26.

Figure 2B:
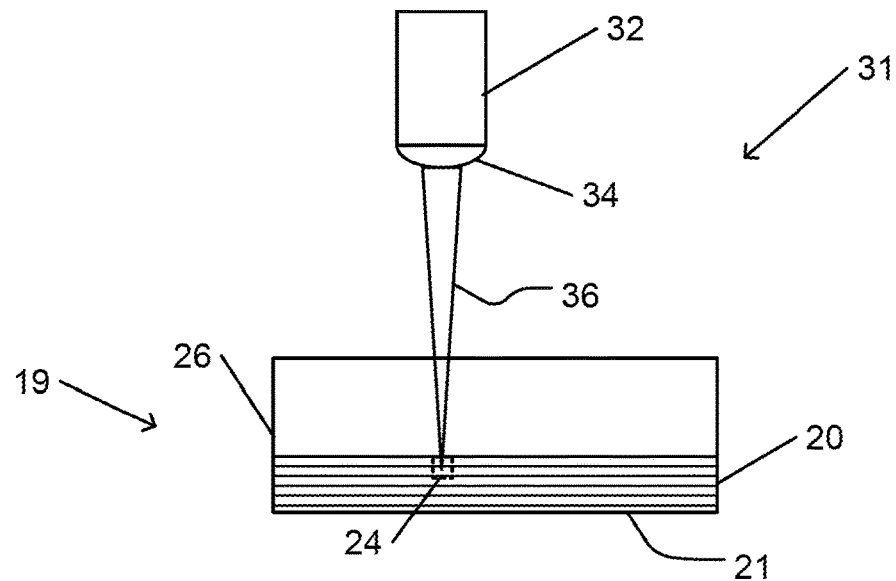
FIG. 2B schematically illustrates components of a variation of the system of FIG. 2A.

FIG. 2B schematically illustrates components of a variation of the system of FIG. 2A.

In alternative photomask treatment system 31, treatment beam 36 traverses photomask substrate 26 before impinging on reflective multilayer 20. In this manner, treatment beam 36 may avoid irradiating the absorber pattern that is on the exposed side of reflective multilayer 20. Alternative photomask treatment system 31 may be configured that treated multilayer region 24 is located at a finite depth within reflective multilayer 20 (e.g., close to photomask substrate 26). Such irradiation via photomask substrate 26 may enable finer control of treatment results than direct irradiation of exposed multilayer surface 21. For example, a wavelength of treatment radiation source 32 may be selected such that treatment beam 36 may traverse photomask substrate 26 without significant absorption, but is strongly absorbed by reflective multilayer 20. In some cases, an exposed surface of photomask substrate 26 may include a coating that is transparent to treatment beam 36.

Heating or other treatment of a region of reflective multilayer 20 to form treated multilayer region 24 may affect the reflectance of treated multilayer region 24.

Figure 3:
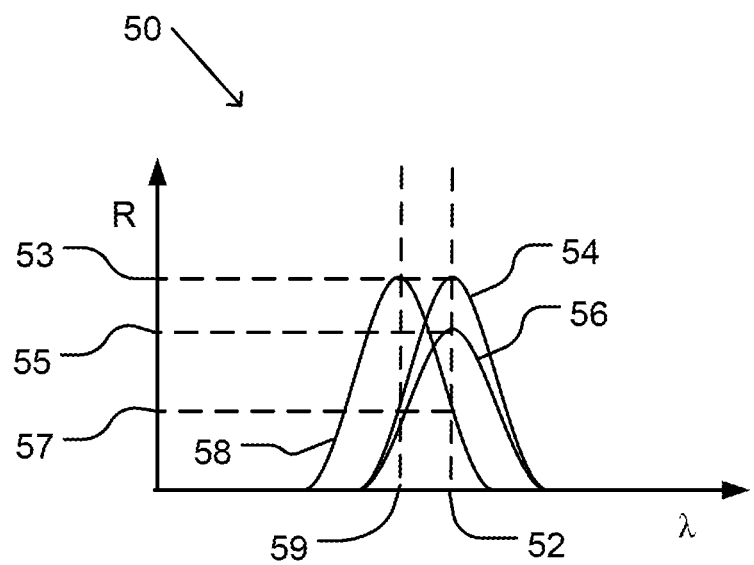
FIG. 3 schematically illustrates modification of reflectance of a region of a reflective multilayer that is treated to correct for CD variation, in accordance with an embodiment of the present invention.

FIG. 3 schematically illustrates modification of reflectance of a region of a reflective multilayer that is treated to correct for CD variation, in accordance with an embodiment of the present invention.

Graph 50 shows various curves representing spectral reflectance (R) of a region of a reflective multilayer as a function of wavelength (λ). Working wavelength 52 represents a wavelength at which an EUV photolithography system operates, and at which the reflectance of the region of the reflective multilayer is of interest. The reflective multilayer, prior to treatment, may be configured for optimal or maximum reflectance at working wavelength 52.

Spectral reflectance curve 54 schematically represents a spectral reflectance of an untreated region of a reflective multilayer (for simplicity, only the central first order peak of the reflectance curve is schematically represented). Spectral reflectance curve 54 is optimized for maximum reflectance value 53 (e.g., about 70% or another value) at working wavelength 52.

Reduced spectral reflectance curve 56 schematically represents a spectral reflectance of a treated region of a reflective multilayer. Reduced spectral reflectance curve 56 may result from a treatment of the reflective multilayer that reduces the local reflectance without affecting the wavelength dependence of the reflectance. The reflectance remains optimized for working wavelength 52. However, peak reflectance value 55 of reduced spectral reflectance curve 56 is less than maximum reflectance value 53 of spectral reflectance curve 54. Similarly, the reflectance value at all wavelengths is reduced relative to spectral reflectance curve 56.

Shifted spectral reflectance curve 58 schematically represents a spectral reflectance of a treated region of a reflective multilayer. Shifted spectral reflectance curve 58 may result from a treatment of the reflective multilayer that shifts the optimum wavelength of the local reflectance without reflectance values. The reflectance of shifted spectral reflectance curve 58 is optimized for shifted wavelength 59. However, reflectance value at shifted wavelength 59 remains equal to maximum reflectance value 53 of spectral reflectance curve 54. However, due to the wavelength shift, the reflectance value of shifted spectral reflectance curve 58 at working wavelength 52 is now equal to off-peak reflectance value 57.

Although in the example of shifted spectral reflectance curve 58, shifted wavelength 59 is shown at a shorter wavelength than working wavelength 52, the shift may be in the opposite direction (with the maximum of the shifted curve at a longer wavelength than working wavelength 52). It may also be noted that all or part of a reflective multilayer may have been non-optimally fabricated such that the maximum reflectance is not at working wavelength 52 (e.g., similar to shifted spectral reflectance curve 58). In such a case, an appropriate treatment of the reflective multilayer may shift the spectral reflectance such that the maximum reflectance is shifted to the working wavelength (e.g., as in spectral reflectance curve 54), thus increasing the reflectance at working wavelength 52 (e.g., from off-peak reflectance value 57 to maximum reflectance value 53).

It may be noted that a treatment of a region of the reflective multilayer may both change a maximum value of the spectral reflectance curve and shift the maximum of the spectral reflectance curve to another wavelength. Thus, the effects that are illustrated by reduced spectral reflectance curve 56 and by shifted spectral reflectance curve 56 may both be present in the treated region.

Treatment parameters for treating a region of a reflective multilayer of a reflective photomask for EUV photolithography may be determined by a calibration process. The calibration process may include treating a plurality of regions of a reflective multilayer. Different regions, or groups of regions, may be treated in accordance with different treatment parameters. The regions may be examined after the treatment to determine the effect of each set of treatment parameters on reflectance. The results of the measurements may be stored in a database or lookup table for later reference.

When a reflective multilayer is to be treated for CD variation correction, a change in reflectance of a region of the reflective multilayer that corrects the CD variation may be calculated. The stored measurement results may be searched to identify a set of parameters that produces the calculated change in reflectance. The region may then be treated in accordance with the identified parameters.

Figure 4:
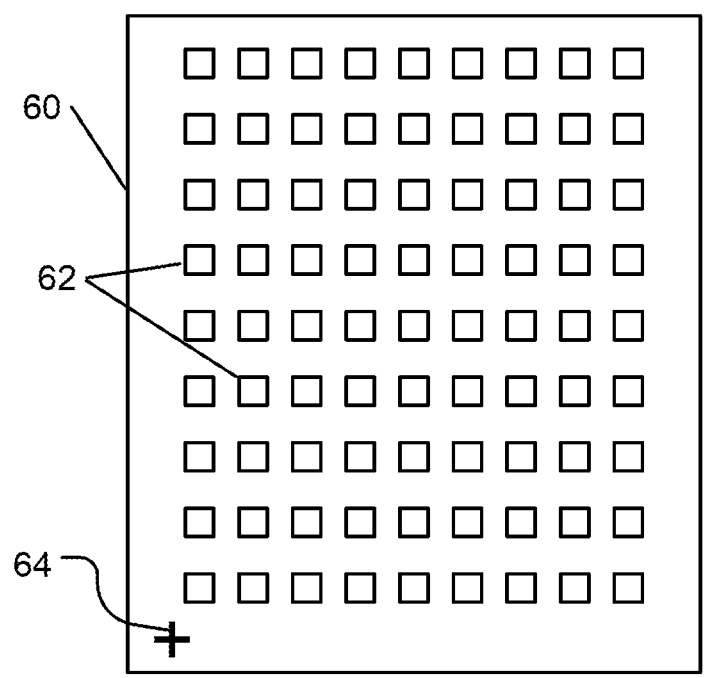
FIG. 4 schematically illustrates a reflective multilayer surface for calibration of treatment to correct for CD variation, in accordance with an embodiment of the present invention.

FIG. 4 schematically illustrates a reflective multilayer surface for calibration of treatment to correct the CD variation, in accordance with an embodiment of the present invention. In discussing FIG. 4, reference is also made to items of FIG. 2.

Each cell 62 of multilayer surface 60 (in the form of a reflective multilayer 20) may be treated. A cell may represent a treated area of any shape or form (and not necessarily square as shown). A position of each cell may be determined by a coordinate system. For example, a coordinate system may be defined relative to one or more fiducial marks 64.

For example, multilayer surface may be positioned in place of reflective layer 20 in photomask treatment system 30. Multilayer 60 may be moved with translation motion 46 such that each cell 62 may be irradiated by treatment beam 36. During irradiation, treatment radiation source 32 or beam optics 34 may be operated such that different cells 62 are irradiated in accordance with different treatment parameters. Variable treatment parameters may include, for example, one or more of pulse energy, pulse duration, pulse rate, scan rate of raster pattern, pitch of raster pattern, total energy deposited, rate of energy deposition, or another treatment parameter. Variable treatment parameters may define focusing conditions (e.g., focal length, relative distances, or other parameters that affect optics or focusing conditions). Treatment parameters for each cell 62 may be stored, e.g., on data storage unit 42, together with coordinates of the corresponding cell 62.

After treatment, each cell 62 may be examined to determine the effect on properties of that cell 62. Various examinations may be automatic or may require involvement by a human observer.

A measurement of EUV reflectance of a cell 62 at the working wavelength may determine a change in reflectance at the working wavelength. A measurement of EUV spectral reflectance may determine if the change in reflectance results from a reduction of peak reflectance or results from a wavelength shift of the reflectance spectrum. A change in reflectance may be stored together with the corresponding treatment parameters in a database or lookup table. The database or lookup table may be consulted when treating a reflective multilayer 20 to form a treated multilayer region 24 with a change in reflectance configured to correct CD variation.

A method of treating a reflective multilayer 20 to form one or more treated multilayer regions 24 may be executed by a processor 40 of controller 38 of a photomask treatment system 30.

Figure 5:
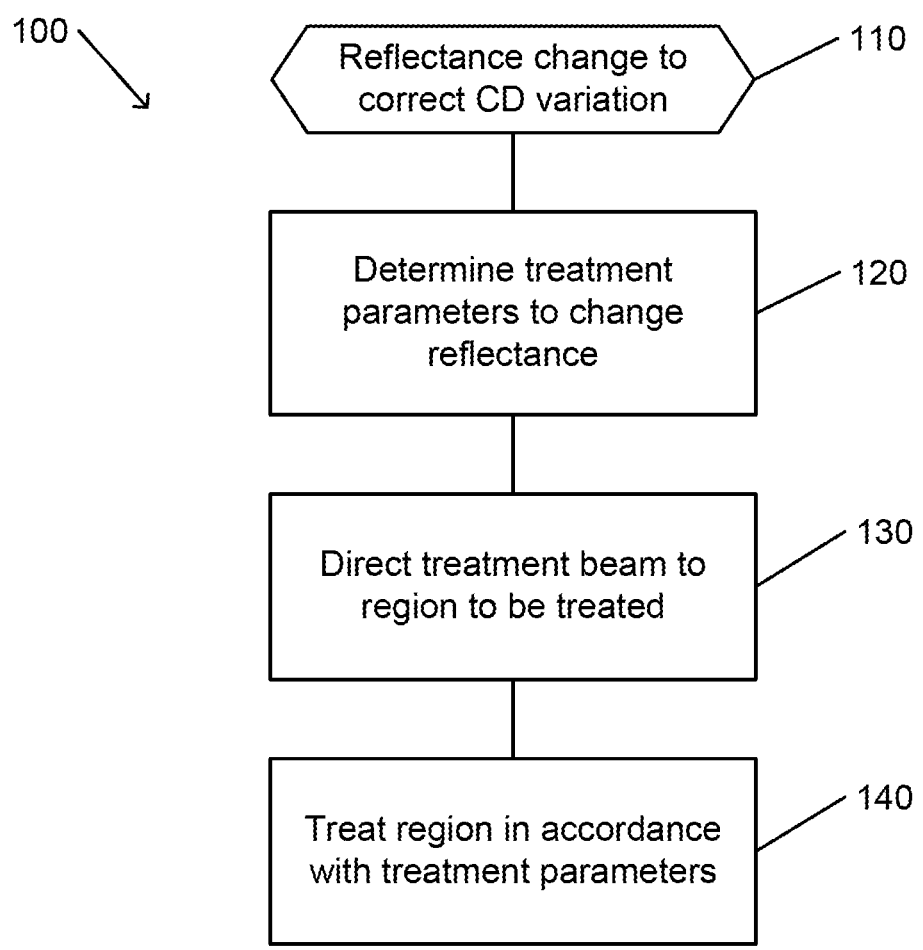
FIG. 5 is a flowchart illustrating a method for correcting CD variations in EUV lithography, in accordance with an embodiment of the present invention.

FIG. 5 is a flowchart illustrating a method for correcting CD variations in EUV lithography, in accordance with an embodiment of the present invention.

It should be understood, with respect to any flowchart referenced herein, that the division of the illustrated method into discrete operations represented by blocks of the flowchart has been selected for convenience and clarity only. Alternative division of the illustrated method into discrete operations is possible with equivalent results. Such alternative division of the illustrated method into discrete operations should be understood as representing other embodiments of the illustrated method.

Similarly, it should be understood that, unless indicated otherwise, the illustrated order of execution of the operations represented by blocks of any flowchart referenced herein has been selected for convenience and clarity only. Operations of the illustrated method may be executed in an alternative order, or concurrently, with equivalent results. Such reordering of operations of the illustrated method should be understood as representing other embodiments of the illustrated method.

CD variation correction method 100 may be executed by a controller of a photomask treatment system. For example, CD variation correction method 100 may be executed by a processor of the controller that is operating in accordance with programmed instructions. CD variation correction method 100 may be performed on reflective multilayer of a reflective photomask for EUV photolithography.

CD variation correction method 100 may be executed when a reflectance change that is required to correct CD variation has been calculated as a result of mapping CD variation (block 110). For example, a calculation of a required reflectance change may have been calculated on the basis of results of EUV photolithography using the reflective photomask. A result of the EUV photolithography, or a photomask itself, may have been inspected by an appropriate inspection device to detect CD variation. A reflectance change to correct the detected CD variation may have been calculated. For example, the reflectance change may be calculated on the basis of a known relationship between an exposure of a photoresist to EUV radiation and a threshold for activation of the photoresist (e.g., the activation threshold varying linearly with the logarithm of the exposure dose). Thus, if the detected CD variation is above a specified value, a reduction of the EUV exposure may change the CD value, thus reducing a width of a printed line or diameter of a hole to, or closer to, the specified value.

Treatment parameters for producing the determined reflectance change may be determined (block 120). Results of a calibration may be utilized to identify the treatment parameters that are required to produce the determined reflectance change. For example, a lookup table or database that was generated or modified during a calibration operation a region of a reflector of EUV photomask to correct CD variation may be utilized to identify treatment parameters to produce the determined reflectance change. In some cases, treatment parameters that correspond to the determined reflectance change may not be present in the calibration table or database. In this case, interpolation among, or extrapolation from, treatment parameters for similar reflectance changes may be utilized to calculate the required treatment parameters.

A treatment beam may be directed to a region of the reflective multilayer that is to be treated (block 130). For example, a laterally translatable stage of the radiation source or of the reflective photomask may be moved to bring the treatment radiation source to the vicinity of the region to be treated. Beam optics may be controlled to aim the treatment beam at the region to be treated.

The region may be treated in accordance with the determined treatment parameters (block 140). For example, a CW or pulsed laser (including ultrashort pulsed laser) beam may be operated to irradiate the region with a predetermined quantity of radiation energy during a predetermined time interval with a predetermined distribution over the area. For example, the beam may be scanned across the surface of the region, e.g., in a raster pattern. The beam may be pulsed in a predetermined manner (e.g., pulse energy, duration, rate, total exposure time, or other pulse parameters).

Typically, a reflective photomask includes a plurality of dies, or active areas. Each die is spatially separated from each adjacent die by border, typically referred to as a black border. The black border may include a layer of a material that absorbs EUV radiation. In some cases, the black border may have a width of about 2 mm to about 3 mm.

In some cases, the absorbing layer may have a thickness of about 50 mm to about 70 mm. (Additional thickness may be precluded by a desire to avoid or minimize shadowing by the absorbing layer.) The layer of EUV absorbing material is typically deposited onto the reflective multilayer of the EUV photomask.

Although ideally the black border should not reflect any EUV radiation, in practice, a typical black border may reflect up to 3% of incident EUV radiation. Much of this reflection is due to reflection by the reflective multilayer of the photomask of radiation that is not absorbed by the EUV absorbing layer. Reflection by the black border could cause unacceptable CD changes and losses of contrast in regions of a die in the vicinity of the black border. In some cases, a region of the EUV absorbing layer may be defective (e.g., may include a hole or other region of reduced absorbance) so as to enable increased (over other regions of the EUV absorbing layer) transmission of EUV radiation to the reflective multilayer.

In accordance with an embodiment of the present invention, the reflectivity of the black border may be reduced by treating the reflective multilayer under the absorbing layer of the black border by heating. For example, radiation from a suitable radiation source, such as a CW laser, a pulsed laser (e.g., an ultrafast, e.g., femtosecond, pulsed laser), or another suitable radiation source. The treatment of the reflective multilayer at the black border may lower the reflectance of the multilayer to a predetermined reflectance value or less. For example, in the case of treatment at the black border, the applied treatment may include deposition of sufficient energy so as to reduce the reflectance of the reflective multilayer to a reflectance value of no more than 5% (e.g., from an initial value of about 60% to 67%, e.g., 65%, to a final value of about 5%, or from another initial value to another final value). As a result, the reflectance of the black border may be reduced to an acceptable value (e.g., from an initial reflectance of about 2.6% prior to treatment, e.g., where the transmittance of the absorbing layer is about 20%, to a final value of about 0.2% after treatment, or from another initial value to another final value).

Reducing reflectance of the reflective multilayer at a black border by radiation heating may be advantageous over other described techniques. For example, radiation treatment to reduce the reflectance may be advantageous over etching away (the absorber and) the multilayer at the black border since such etching could be difficult (e.g., requiring etching to a depth of about 300 nm or more), could promote degradation of the photomask (e.g., during cleaning), or could lead to unwanted electrical charging effects.

Figure 6:
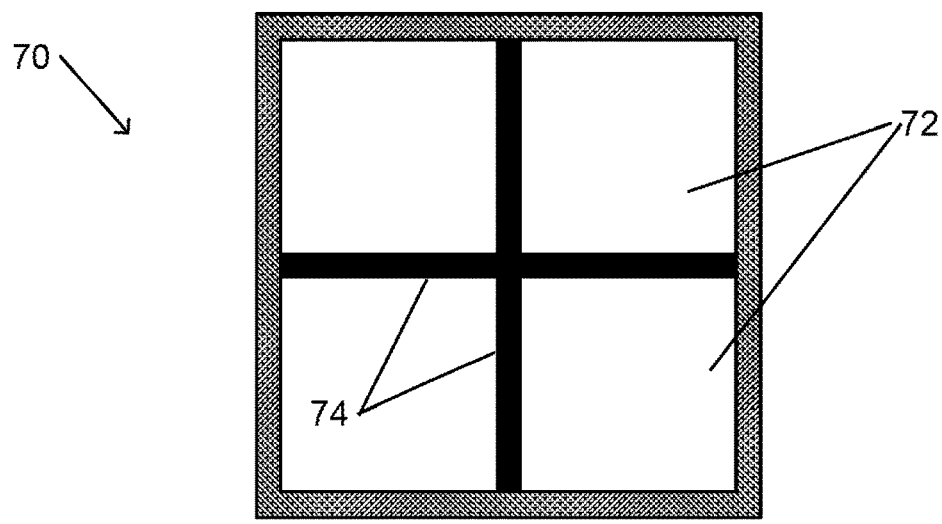
FIG. 6 schematically illustrates a layout of a photomask with a black border to which a reflection reducing treatment is applicable, in accordance with an embodiment of the present invention.

FIG. 6 schematically illustrates a layout of a EUV photomask with a black border to which a reflection reducing treatment is applicable, in accordance with an embodiment of the present invention.

EUV photomask 70 includes a plurality of dies 72 that are separated by black borders 74.

Figure 7:
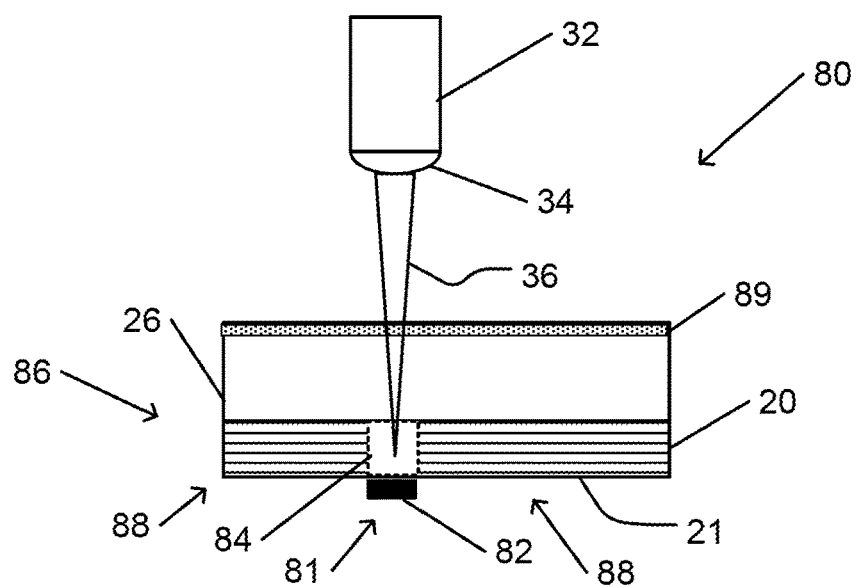
FIG. 7 schematically illustrates application of a treatment for reducing reflectance of a black border, in accordance with an embodiment of the present invention.

FIG. 7 schematically illustrates application of a treatment for reducing reflectance of a black border, in accordance with an embodiment of the present invention.

Reflective photomask 86 includes a black border 81 that separates photomask dies 88. Black border 81 includes an absorbing layer 82 that is deposited on reflective multilayer 20.

In black border treatment system 80, treatment beam 36 deposits heating radiation within treated multilayer region 84 of reflective multilayer 20. The energy that is deposited in treated multilayer region 84 reduces the reflection of EUV radiation by treated multilayer region 84. The resulting reduction in reflectance of treated multilayer region 84 may be sufficient to reduce reflectance of black border 81 to an acceptable level.

In some cases, treated multilayer treatment beam 36 may be limited to a region of reflective multilayer 20 that is in the vicinity of a known defect in absorbing layer 82. For example, a defect may have been detected using one or more inspection or testing techniques.

In some cases, treatment beam 36 may traverse a backside coating layer 89 and photomask substrate 26. For example, backside coating layer 89 may include chromium nitride (CrN).

Figure 8:
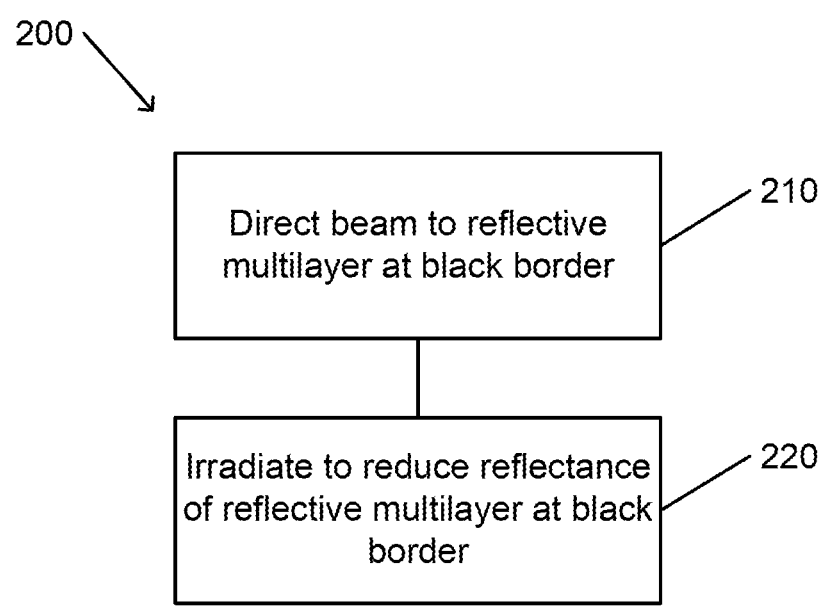
FIG. 8 is a flowchart illustrating a method for reducing reflectance of a black border, in accordance with an embodiment of the present invention.

FIG. 8 is a flowchart illustrating a method for reducing reflectance of a black border, in accordance with an embodiment of the present invention.

Black border treatment method 200 may be executed by a controller of a photomask treatment system. For example, black border treatment method 200 may be executed by a processor of the controller that is operating in accordance with programmed instructions. Black border treatment method 200 may be performed on a black border of a reflective photomask for EUV photolithography.

A treatment beam is directed to the reflective multilayer at the black border (block 210). For example, a laterally translatable stage of the radiation source or of the reflective photomask may be moved to bring the treatment radiation source to the vicinity of the black border. Beam optics may be controlled to aim the treatment beam at the reflective multilayer at the black border. In some cases, the treatment beam may be directed to the reflective layer at a region of the black border that has been found to be defective.

The treatment beam may be operated to irradiate the reflective multilayer at the black border in order to reduce the reflectance of the reflective multilayer at the black border (block 220). For example, a CW or pulsed laser (including ultrashort pulsed laser) beam may be operated to irradiate the reflective multilayer at the black border with a predetermined quantity of radiation energy during a predetermined time interval with a predetermined distribution over the area. For example, the beam may be scanned across the surface of the region, e.g., in a raster pattern. The beam may be pulsed in a predetermined manner (e.g., pulse energy, duration, rate, total exposure time, or other pulse parameters).

Different embodiments are disclosed herein. Features of certain embodiments may be combined with features of other embodiments; thus certain embodiments may be combinations of features of multiple embodiments. The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A method of correcting a critical dimension (CD) variation in extreme ultraviolet (EUV) photolithography, the method comprising:
    mapping the CD variation of a wafer exposure field formed by a photolithography system that includes an EUV photolithography photomask;
    determining one or a plurality of parameters of a treatment to produce a change in reflectance at a working wavelength of EUV radiation in a region of a reflective multilayer of the photomask, the change in reflectance being calculated to correct the mapped CD variation;
    directing a treatment beam to the region of the reflective multilayer; and
    treating the region of the reflective multilayer with the beam in accordance with the determined one or a plurality of parameters.

2. The method of claim 1, wherein the treatment beam comprises a femtosecond pulsed laser.

3. The method of claim 1, wherein a parameter of said one or a plurality of parameters is selected from a group of parameters consisting of pulse energy, pulse duration, pulse rate, exposure time, scan rate, focal length, location, distance, and pitch of a scanning pattern.

4. The method of claim 1, wherein determining said one or a plurality of parameters comprises utilizing a result of a calibration that includes treating a plurality of regions of a reflective multilayer surface in accordance with different values of said one or a plurality of parameters.

5. The method of claim 1, wherein the treatment beam is directed to the region via a substrate of the photomask.

6. The method of claim 1, wherein the produced change in reflectance at the working wavelength comprises changing a peak value of a reflectance spectrum of the region or wavelength shifting of a peak of a reflectance spectrum of the region.

7. The method of claim 1, wherein directing the beam to the region comprises translating a source of the beam or the photomask, or operating beam optics.

8. The method of claim 1, wherein treating the region with the beam comprises scanning the beam across the region with a raster pattern that includes a sequence of overlapping laser spots.

9. The method of claim 8, wherein a ratio of a diameter of a laser spot of the sequence of overlapping laser spots to a pitch of the raster pattern is in the range of 1 to 100.

10. The method of claim 1, wherein an energy density of the treatment is less than 200 mJ/cm$^2$.

11. The method of claim 1, wherein mapping the CD variation comprises examination of a wafer that is printed using the photomask, examination of the photomask, or sensing a pattern of radiation in the photolithography system.

12. The method of claim 1, wherein the treatment beam heats the region.

* * * * *